US010655225B2

(12) United States Patent
Gomm et al.

(10) Patent No.: US 10,655,225 B2
(45) Date of Patent: May 19, 2020

(54) SUBSTRATE PEDESTAL MODULE INCLUDING BACKSIDE GAS DELIVERY TUBE AND METHOD OF MAKING

(71) Applicant: Lam Research Corporation, Fremont, CA (US)

(72) Inventors: Troy Alan Gomm, Sherwood, OR (US); Nick Ray Linebarger, Jr., Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 127 days.

(21) Appl. No.: 15/662,553

(22) Filed: Jul. 28, 2017

(65) Prior Publication Data

US 2017/0321324 A1    Nov. 9, 2017

Related U.S. Application Data

(62) Division of application No. 14/710,132, filed on May 12, 2015, now Pat. No. 9,738,975.

(51) Int. Cl.
*C23C 16/458* (2006.01)
*C23C 16/505* (2006.01)
(Continued)

(52) U.S. Cl.
CPC ...... *C23C 16/4586* (2013.01); *B32B 37/1018* (2013.01); *C23C 16/4581* (2013.01);
(Continued)

(58) Field of Classification Search
CPC ............ C23C 16/4586; C23C 16/4581; C23C 16/505; C23C 16/52; H01L 21/67103;
(Continued)

(56) References Cited

U.S. PATENT DOCUMENTS 5,569,356 A    10/1996 Lenz et al.
5,688,331 A    11/1997 Aruga et al.
(Continued)

FOREIGN PATENT DOCUMENTS

CN    1461288 A    12/2003
CN    1779940 A    5/2006
(Continued)

OTHER PUBLICATIONS

"Chinese Application Serial No. 201610312750.1, Response filed Dec. 18, 2019 to Office Action dated Jun. 3, 2019", Amended Claims in English, 6 pgs.
(Continued)

*Primary Examiner* — Charlee J. C. Bennett
(74) *Attorney, Agent, or Firm* — Schwegman Lundberg & Woessner, P.A.

(57) ABSTRACT

A semiconductor substrate processing apparatus includes a vacuum chamber having a processing zone in which a semiconductor substrate may be processed, a process gas source in fluid communication with the vacuum chamber for supplying a process gas into the vacuum chamber, a showerhead module through which process gas from the process gas source is supplied to the processing zone of the vacuum chamber, and a substrate pedestal module. The substrate pedestal module includes a platen made of ceramic material having an upper surface configured to support a semiconductor substrate thereon during processing, a stem made of ceramic material having an upper stem flange that supports the platen, and a backside gas tube made of ceramic material that is located in an interior of the stem. The backside gas tube includes an upper gas tube flange that is located between a lower surface of the platen and an upper surface of the upper stem flange wherein the backside gas tube is in fluid communication with at least one backside gas passage
(Continued)

of the platen and the backside gas tube is configured to supply a backside gas to a region below a lower surface of a semiconductor substrate that is to be supported on the upper surface of the platen during processing.

13 Claims, 3 Drawing Sheets

(51) Int. Cl.
    *H01L 21/687*     (2006.01)
    *H01L 21/67*     (2006.01)
    *H01L 21/683*     (2006.01)
    *C23C 16/52*     (2006.01)
    *B32B 37/10*     (2006.01)

(52) U.S. Cl.
    CPC ............ *C23C 16/505* (2013.01); *C23C 16/52* (2013.01); *H01L 21/67103* (2013.01); *H01L 21/6831* (2013.01); *H01L 21/68757* (2013.01); *H01L 21/68785* (2013.01); *H01L 21/68792* (2013.01); *B32B 2457/00* (2013.01)

(58) Field of Classification Search
    CPC ........... H01L 21/6831; H01L 21/68757; H01L 21/68785; H01L 21/68792; B32B 2457/00; B23B 37/1018
    USPC .................. 118/715–733; 156/345.1–345.55
    See application file for complete search history.

(56) References Cited

U.S. PATENT DOCUMENTS

| | | | |
|---|---|---|---|
| 6,035,101 A | 3/2000 | Sajoto et al. | |
| 6,103,074 A * | 8/2000 | Khominich | C23C 14/228 204/192.38 |
| 6,223,447 B1 | 5/2001 | Yudovsky et al. | |
| 6,464,795 B1 * | 10/2002 | Sherstinsky | C23C 16/45521 118/715 |
| 6,494,955 B1 | 12/2002 | Lei et al. | |
| 6,524,428 B2 | 2/2003 | Tamura et al. | |
| 6,616,767 B2 | 9/2003 | Zhao et al. | |
| 6,860,965 B1 | 3/2005 | Stevens | |
| 6,962,348 B2 | 11/2005 | Fink | |
| 6,997,993 B2 | 2/2006 | Yamaguchi et al. | |
| 7,126,808 B2 | 10/2006 | Koo et al. | |
| 7,241,346 B2 | 7/2007 | Hanamachi et al. | |
| 7,274,006 B2 | 9/2007 | Okajima et al. | |
| 7,632,356 B2 * | 12/2009 | Tomita | H01L 21/68735 118/715 |
| 7,645,341 B2 | 1/2010 | Kennedy et al. | |
| 7,737,035 B1 | 6/2010 | Lind et al. | |
| 7,869,184 B2 | 1/2011 | Steger | |
| 8,294,069 B2 | 10/2012 | Goto et al. | |
| 8,394,199 B2 * | 3/2013 | Tomita | H01L 21/67103 118/715 |
| 8,801,950 B2 | 8/2014 | Lee | |
| 8,840,754 B2 | 9/2014 | Hao | |
| 8,851,463 B2 | 10/2014 | Angelov et al. | |
| 9,490,150 B2 * | 11/2016 | Tzu | H01L 21/67103 |
| 9,738,975 B2 | 8/2017 | Gomm et al. | |
| 10,147,610 B1 * | 12/2018 | Lingampalli | H01L 21/28556 |
| 10,177,024 B2 * | 1/2019 | Gomm | H01L 21/68785 |
| 2002/0050246 A1 * | 5/2002 | Parkhe | H01L 21/67109 118/500 |
| 2003/0136520 A1 * | 7/2003 | Yudovsky | C23C 16/45521 156/345.51 |
| 2003/0150563 A1 * | 8/2003 | Kuibara | B32B 18/00 156/345.51 |
| 2003/0183341 A1 | 10/2003 | Yamaguchi et al. | |
| 2004/0194710 A1 * | 10/2004 | Hanamachi | C23C 16/4409 118/728 |
| 2006/0102595 A1 | 5/2006 | Inoue | |
| 2006/0186109 A1 * | 8/2006 | Goto | H01L 21/67103 219/444.1 |
| 2006/0231388 A1 * | 10/2006 | Mullapudi | C23C 14/022 204/298.01 |
| 2007/0040265 A1 * | 2/2007 | Umotoy | C23C 16/45521 257/704 |
| 2007/0151517 A1 * | 7/2007 | Baik | C23C 14/50 118/725 |
| 2007/0169703 A1 | 7/2007 | Elliot et al. | |
| 2008/0078426 A1 * | 4/2008 | Miya | H01L 21/67028 134/30 |
| 2009/0235866 A1 | 9/2009 | Kataigi et al. | |
| 2009/0277388 A1 * | 11/2009 | Lubomirsky | C23C 16/4581 118/725 |
| 2010/0163183 A1 * | 7/2010 | Tanaka | H01L 21/67109 156/345.27 |
| 2011/0064878 A1 * | 3/2011 | Suzuki | C23C 16/45521 427/255.5 |
| 2011/0096461 A1 | 4/2011 | Yoshikawa et al. | |
| 2011/0206843 A1 * | 8/2011 | Gurary | C23C 16/45521 427/248.1 |
| 2011/0303154 A1 * | 12/2011 | Kim | H01L 21/68764 118/728 |
| 2012/0018416 A1 * | 1/2012 | Goto | H01L 21/67103 219/481 |
| 2012/0031338 A1 * | 2/2012 | Lee | C23C 16/4584 118/724 |
| 2012/0204796 A1 * | 8/2012 | Ruda Y Witt | C23C 16/458 118/725 |
| 2012/0211933 A1 * | 8/2012 | Goto | G01K 7/02 269/293 |
| 2013/0092086 A1 | 4/2013 | Keil et al. | |
| 2014/0087587 A1 | 3/2014 | Lind | |
| 2014/0231019 A1 | 8/2014 | Kajihara | |
| 2014/0302256 A1 | 10/2014 | Chen et al. | |
| 2015/0011096 A1 | 1/2015 | Chandrasekharan et al. | |
| 2015/0056787 A1 * | 2/2015 | Brenninger | C23C 16/4584 438/478 |
| 2015/0376780 A1 * | 12/2015 | Khaja | C23C 16/4405 134/1.1 |
| 2016/0002779 A1 | 1/2016 | Lin et al. | |
| 2016/0099164 A1 | 4/2016 | Kataigi et al. | |
| 2016/0333475 A1 | 11/2016 | Gomm et al. | |

FOREIGN PATENT DOCUMENTS

| | | |
|---|---|---|
| CN | 101154560 A | 4/2008 |
| CN | 106148915 A | 11/2016 |
| JP | 07-153706 A | 6/1995 |
| JP | 2012-182221 A | 9/2012 |
| JP | 2016213456 A | 12/2016 |
| KR | 20160133373 A | 11/2016 |

OTHER PUBLICATIONS

"Japanese Application Serial No. 2016-92266, Voluntary Amendment filed Jul. 12, 2019", w/ English Claims, 5 pgs.

U.S. Appl. No. 14/710,132, Decision on Pre-Appeal Brief Request mailed May 18, 2017, 1 pg.

U.S. Appl. No. 14/710,132, Final Office Action dated Feb. 6, 2017, 22 pgs.

U.S. Appl. No. 14/710,132, Non Final Office Action dated Sep. 9, 2016, 14 pgs.

U.S. Appl. No. 14/710,132, Notice of Allowance dated May 18, 2017, 10 pgs.

U.S. Appl. No. 14/710,132, Pre-Appeal Brief Request filed Mar. 17, 2017, 5 pgs.

U.S. Appl. No. 14/710,132, Response filed Jun. 3, 2016 to Restriction Requirement dated Apr. 19, 2016, 1 pg.

U.S. Appl. No. 14/710,132, Response filed Nov. 29, 2016 to Non Final Office Action dated Sep. 9, 2016, 15 pgs.

U.S. Appl. No. 14/710,132, Restriction Requirement dated Apr. 19, 2016, 5 pgs.

(56) References Cited

OTHER PUBLICATIONS

Office Action dated Jun. 3, 2019 in corresponding Chinese Patent Application No. 201610312750.1, 7 pages.

* cited by examiner

SUBSTRATE PEDESTAL MODULE INCLUDING BACKSIDE GAS DELIVERY TUBE AND METHOD OF MAKING

CROSS REFERENCE TO RELATED APPLICATIONS

This application is a divisional application of U.S. patent application Ser. No. 14/710,132, filed May 12, 2015 entitled "Substrate Pedestal Module Including Backside Gas Delivery Tube and Method of Making", the content of which is incorporated herein in its entirety.

FIELD OF THE INVENTION

This invention pertains to semiconductor substrate processing apparatuses for processing semiconductor substrates, and may find particular use in plasma-enhanced chemical vapor depositions processing apparatuses operable to deposit thin films.

BACKGROUND

Semiconductor substrate processing apparatuses are used to process semiconductor substrates by techniques including etching, physical vapor deposition (PVD), chemical vapor deposition (CVD), plasma-enhanced chemical vapor deposition (PECVD), atomic layer deposition (ALD), plasma-enhanced atomic layer deposition (PEALD), pulsed deposition layer (PDL), plasma-enhanced pulsed deposition layer (PEPDL), and resist removal. One type of semiconductor substrate processing apparatus is a plasma processing apparatus that includes a reaction chamber containing upper and lower electrodes wherein a radio frequency (RF) power is applied between the electrodes to excite a process gas into plasma for processing semiconductor substrates in the reaction chamber.

SUMMARY

Disclosed herein is a semiconductor substrate processing apparatus for processing semiconductor substrates. The semiconductor substrate processing apparatus comprises a vacuum chamber including a processing zone in which a semiconductor substrate may be processed, a process gas source in fluid communication with the vacuum chamber for supplying a process gas into the vacuum chamber, a showerhead module through which process gas from the process gas source is supplied to the processing zone of the vacuum chamber, and a substrate pedestal module. The substrate pedestal module includes a platen made of ceramic material having an upper surface configured to support a semiconductor substrate thereon during processing, a stem made of ceramic material having an upper stem flange that supports the platen, and a backside gas tube made of ceramic material that is located in an interior of the stem. The backside gas tube includes an upper gas tube flange that is located between a lower surface of the platen and an upper surface of the upper stem flange wherein the backside gas tube is in fluid communication with at least one backside gas passage of the platen and the backside gas tube is configured to supply a backside gas to a region below a lower surface of a semiconductor substrate that is to be supported on the upper surface of the platen during processing.

Also disclosed herein is a substrate pedestal module of a semiconductor substrate processing apparatus. The substrate pedestal module comprises a platen having an upper surface configured to support a semiconductor substrate thereon during processing, a stem having an upper stem flange that supports the platen, and a backside gas tube that is located in an interior of the stem. The backside gas tube includes an upper gas tube flange that is located between a lower surface of the platen and an upper surface of the upper stem flange wherein the backside gas tube is in fluid communication with at least one backside gas passage of the platen and the backside gas tube is configured to supply a backside gas to a region below a lower surface of a semiconductor substrate that is to be supported on the upper surface of the platen during processing.

Further disclosed herein is a method of making a substrate pedestal module of a semiconductor substrate processing apparatus. The method of making the substrate pedestal module includes positioning an upper ceramic surface of an upper gas tube flange against a lower ceramic surface of a platen, and diffusion bonding the upper ceramic surface of the upper gas tube flange to the lower ceramic surface of the platen so as to form a vacuum seal.

BRIEF DESCRIPTION OF THE DRAWING FIGURES

DETAILED DESCRIPTION

In the following detailed description, numerous specific embodiments are set forth in order to provide a thorough understanding of the apparatus and methods disclosed herein. However, as will be apparent to those skilled in the art, the present embodiments may be practiced without these specific details or by using alternate elements or processes. In other instances, well-known processes, procedures, and/or components have not been described in detail so as not to unnecessarily obscure aspects of embodiments disclosed herein. As used herein the term "about" refers to ±10%.

As indicated, present embodiments provide apparatus and associated methods for processing a semiconductor substrate in a semiconductor substrate processing apparatus such as a chemical vapor deposition apparatus or a plasma-enhanced chemical vapor deposition apparatus. The apparatus and methods are particularly applicable for use in conjunction with high temperature processing of semiconductor substrates such as a high temperature deposition processes wherein a semiconductor substrate being processed is heated to temperatures greater than about 550° C., such as about 550° C. to about 650° C. or more.

Figure 1:
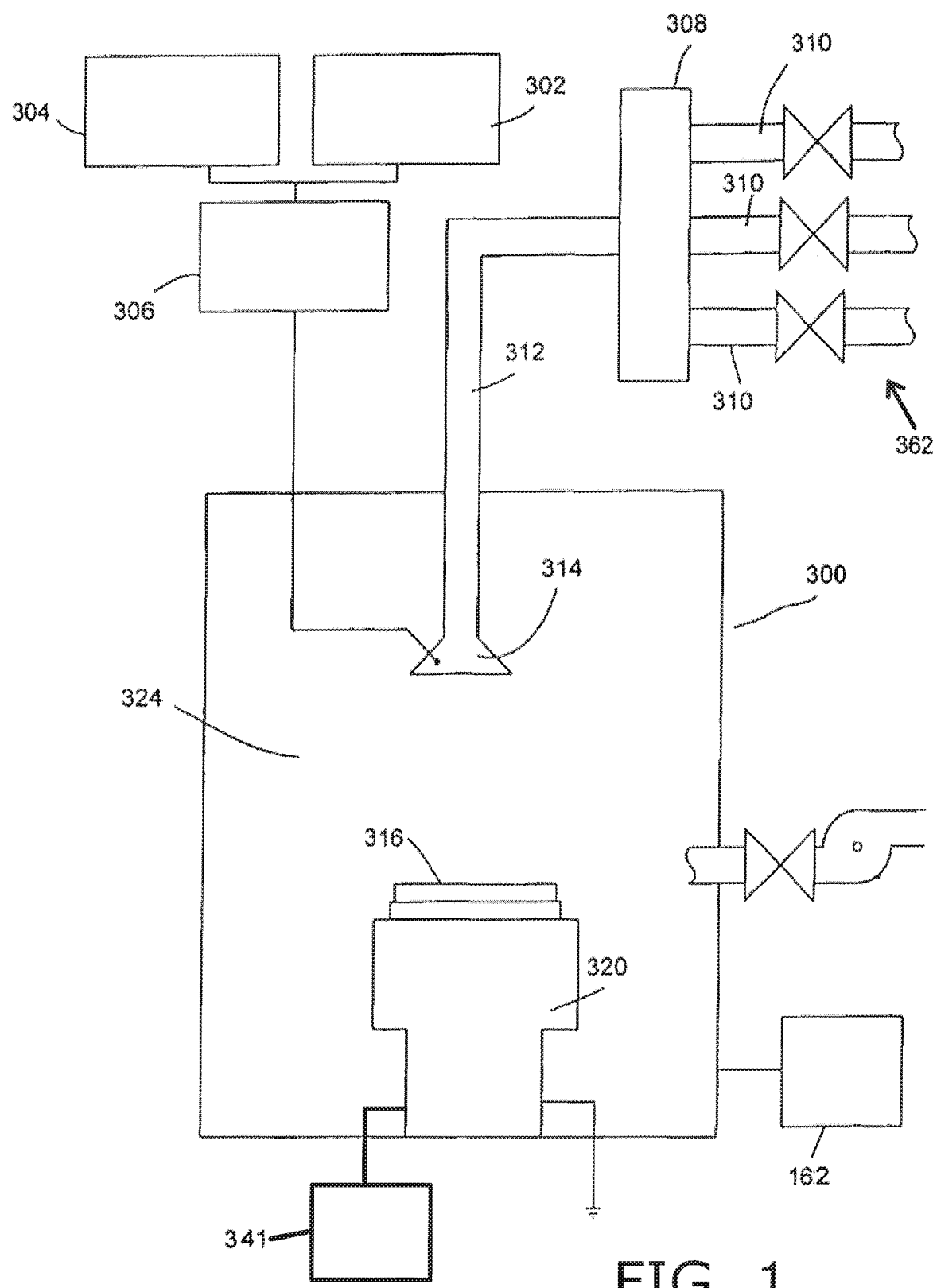
FIG. 1 illustrates a schematic diagram showing an overview of a chemical deposition apparatus in accordance with embodiments disclosed herein.

Embodiments disclosed herein are preferably implemented in a plasma-enhanced chemical deposition apparatus (i.e. PECVD apparatus, PEALD apparatus, or PEPDL apparatus), however, they are not so limited. FIG. 1 provides a simple block diagram depicting various semiconductor substrate plasma processing apparatus components arranged for implementing embodiments as disclosed herein. As shown, a semiconductor substrate plasma processing apparatus 300 includes a vacuum chamber 324 that serves to contain plasma in a processing zone, which is generated by a capacitor type system including a showerhead module 314 having an upper RF electrode (not shown) therein working in conjunction with a substrate pedestal module 320 having a lower RF electrode (not shown) therein. At least one RF generator is operable to supply RF energy into a processing zone above an upper surface of a semiconductor substrate 316 in the vacuum chamber 324 to energize process gas supplied into the processing zone of the vacuum chamber 324 into plasma such that a plasma deposition process may be performed in the vacuum chamber 324. For example, a high-frequency RF generator 302 and a low-frequency RF generator 304 may each be connected to a matching network 306, which is connected to the upper RF electrode of the showerhead module 314 such that RF energy may be supplied to the processing zone above the semiconductor substrate 316 in the vacuum chamber 324.

The power and frequency of RF energy supplied by matching network 306 to the interior of the vacuum chamber 324 is sufficient to generate plasma from the process gas. In an embodiment both the high-frequency RF generator 302 and the low-frequency RF generator 304 are used, and in an alternate embodiment, just the high-frequency RF generator 302 is used. In a process, the high-frequency RF generator 302 may be operated at frequencies of about 2-100 MHz; in a preferred embodiment at 13.56 MHz or 27 MHz. The low-frequency RF generator 304 may be operated at about 50 kHz to 2 MHz; in a preferred embodiment at about 350 to 600 kHz. The process parameters may be scaled based on the chamber volume, substrate size, and other factors. Similarly, the flow rates of process gas, may depend on the free volume of the vacuum chamber or processing zone.

An upper surface of the substrate pedestal module 320 supports a semiconductor substrate 316 during processing within the vacuum chamber 324. The substrate pedestal module 320 can include a chuck to hold the semiconductor substrate and/or lift pins to raise and lower the semiconductor substrate before, during and/or after the deposition and/or plasma treatment processes. In an alternate embodiment, the substrate pedestal module 320 can include a carrier ring to raise and lower the semiconductor substrate before, during and/or after the deposition and/or plasma treatment processes. The chuck may be an electrostatic chuck, a mechanical chuck, or various other types of chuck as are available for use in the industry and/or research. Details of a lift pin assembly for a substrate pedestal module including an electrostatic chuck can be found in commonly-assigned U.S. Pat. No. 8,840,754, which is incorporated herein by reference in its entirety. Details of a carrier ring for a substrate pedestal module can be found in commonly-assigned U.S. Pat. No. 6,860,965, which is incorporated herein by reference in its entirety. A backside gas supply 341 is operable to supply a heat transfer gas or purge gas through the substrate pedestal module 320 to a region below a lower surface of the semiconductor substrate during processing. The substrate pedestal module 320 includes the lower RF electrode therein wherein the lower RF electrode is preferably grounded during processing, however in an alternate embodiment, the lower RF electrode may be supplied with RF energy during processing.

To process a semiconductor substrate in the vacuum chamber 324 of the semiconductor substrate plasma processing apparatus 300, process gases are introduced from a process gas source 362 into the vacuum chamber 324 via inlet 312 and showerhead module 314 wherein the process gas is formed into plasma with RF energy such that a film may be deposited onto the upper surface of the semiconductor substrate. In an embodiment, multiple source gas lines 310 may be connected to a heated manifold 308. The gases may be premixed or supplied separately to the chamber. Appropriate valving and mass flow control mechanisms are employed to ensure that the correct gases are delivered through the showerhead module 314 during semiconductor substrate processing. During the processing, a backside heat transfer gas or purge gas is supplied to a region below a lower surface of the semiconductor substrate supported on the substrate pedestal module 320. Preferably, the processing is at least one of chemical vapor deposition processing, plasma-enhanced chemical vapor deposition processing, atomic layer deposition processing, plasma-enhanced atomic layer deposition processing, pulsed deposition layer processing, or plasma-enhanced pulsed deposition layer processing.

In certain embodiments, a system controller 162 is employed to control process conditions during deposition, post deposition treatments, and/or other process operations. The controller 162 will typically include one or more memory devices and one or more processors. The processor may include a CPU or computer, analog and/or digital input/output connections, stepper motor controller boards, etc.

In certain embodiments, the controller 162 controls all of the activities of the apparatus. The system controller 162 executes system control software including sets of instructions for controlling the timing of the processing operations, frequency and power of operations of the low-frequency RF generator 304 and the high-frequency RF generator 302, flow rates and temperatures of precursors and inert gases and their relative mixing, temperature of a semiconductor substrate 316 supported on an upper surface of the substrate pedestal module 320 and a plasma exposed surface of the showerhead module 314, pressure of the vacuum chamber 324, and other parameters of a particular process. Other computer programs stored on memory devices associated with the controller may be employed in some embodiments.

Typically there will be a user interface associated with controller 162. The user interface may include a display screen, graphical software displays of the apparatus and/or process conditions, and user input devices such as pointing devices, keyboards, touch screens, microphones, etc.

A non-transitory computer machine-readable medium can comprise program instructions for control of the apparatus. The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the semiconductor substrate, pressure of the chamber and other parameters of a particular process. These parameters are provided to the user in the form of a recipe, and may be entered utilizing the user interface.

Signals for monitoring the process may be provided by analog and/or digital input connections of the system controller. The signals for controlling the process are output on the analog and digital output connections of the apparatus.

The system software may be designed or configured in many different ways. For example, various chamber component subroutines or control objects may be written to control operation of the chamber components necessary to carry out deposition processes. Examples of programs or sections of programs for this purpose include substrate timing of the processing steps code, flow rates and temperatures of precursors and inert gases code, and a code for pressure of the vacuum chamber 324.

Figure 2:
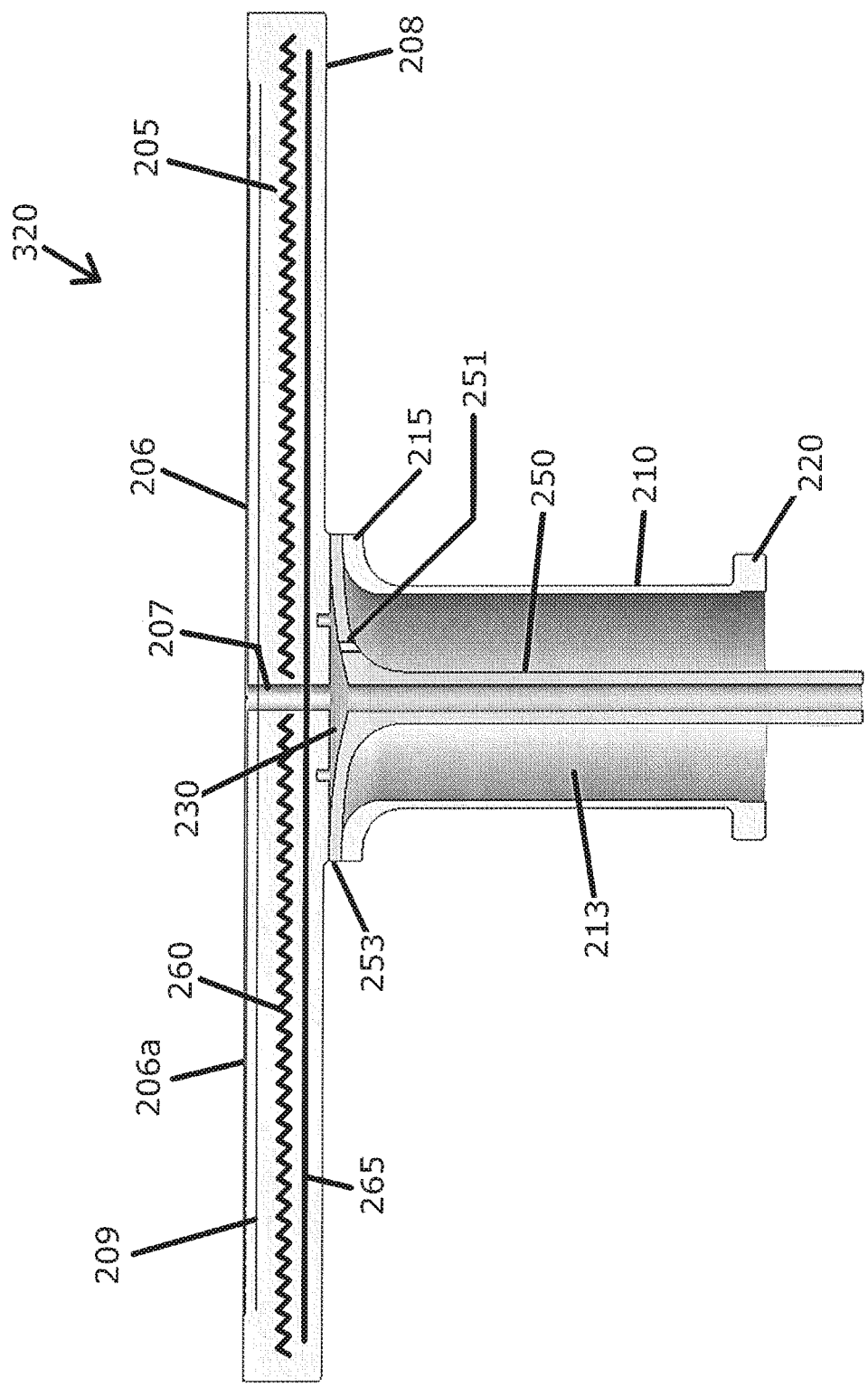
FIG. 2 shows a cross section of a substrate pedestal module in accordance with an embodiment as disclosed herein.
Figure 3:
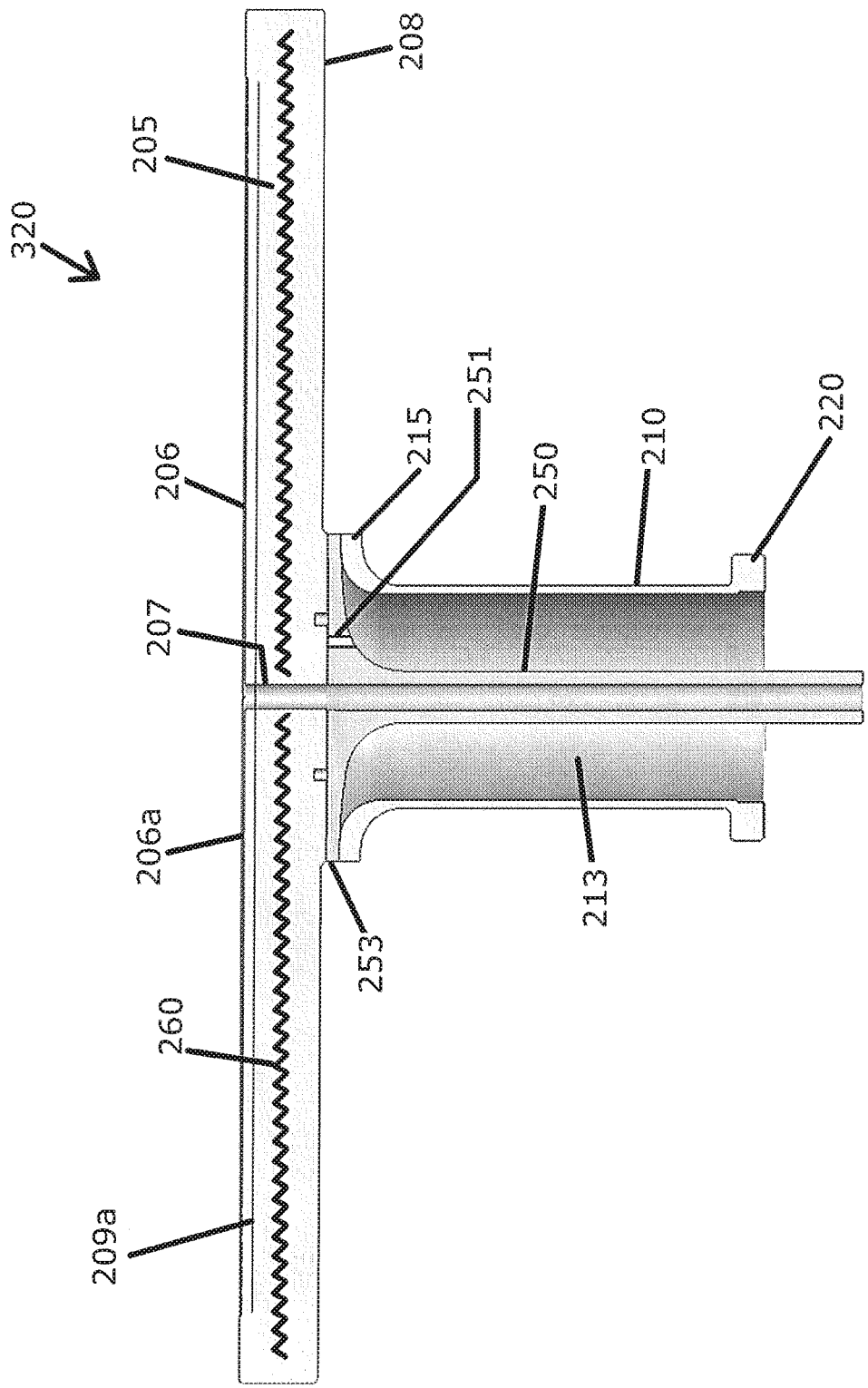
FIG. 3 illustrates a cross section of a substrate pedestal module in accordance with an embodiment as disclosed herein.

FIGS. 2 and 3 illustrate cross sections of a substrate pedestal module 320 according to embodiments as disclosed herein. As shown in FIGS. 2 and 3, the substrate pedestal module 320 includes a platen 205 made of ceramic material having an upper surface 206 that supports a semiconductor substrate thereon during processing of the semiconductor substrate. A stem 210 made of ceramic material extends downwardly from a lower surface 208 of the platen 205 wherein the stem 210 includes an upper stem flange 215 that supports the platen 205 and a lower stem flange 220 that may be attached to a base or adapter (not shown) such that the substrate pedestal module 320 may be supported in a vacuum chamber of a semiconductor substrate processing apparatus. By making the substrate pedestal module 320 from ceramic materials rather than a metal material, such as aluminum or an aluminum alloy, the substrate pedestal module 320 may withstand high temperatures achieved during high temperature substrate processing, such as temperatures greater than about 550° C. or temperatures greater than about 650° C.

The substrate pedestal module 320 includes a backside gas tube 250 made of ceramic that is located in an interior 213 of the stem 210. In an embodiment, the backside gas tube 250 is centrally located in the interior 213 of the stem 210. In an alternate embodiment, the backside gas tube 250 is located off-center in the interior of the stem 210. The backside gas tube 250 includes an upper gas tube flange 253 that is located between a lower surface 208 of the platen 205 and an upper surface of the upper stem flange 215. The backside gas tube 250 is in fluid communication with at least one backside gas passage 207 of the platen 205 such that a backside gas may be supplied through the backside gas tube 250 and the backside gas passage 207 to a region below a lower surface of a semiconductor substrate that is supported on the upper surface 206 of the platen 205 during processing. In an embodiment, an outer diameter of the upper stem flange 215 and an outer diameter of the upper gas tube flange 253 can be equal to or about equal to an outer diameter of the platen 205. Preferably, the outer diameter of the upper stem flange 215 and an outer diameter of the upper gas tube flange 253 are less than the outer diameter of the platen 205. The outer diameter of the upper stem flange 215, the outer diameter of the upper gas tube flange 253 and the outer diameter of the stem 210, as well as the thickness of the stem 210 wall are selected such that the interior 213 of the stem 210, which is maintained at atmospheric pressure during processing, can accommodate electrical connections that are disposed in the interior 213 thereof as well as withstand the pressure differential between the vacuum pressure surrounding the stem 210 and the atmospheric pressure in the interior 213 of the stem 210. Preferably, an outer periphery of the upper gas tube flange 253 is located on a radius no greater than ¼ the outer diameter of the platen 205.

The platen 205 can include at least one electrostatic clamping electrode 209 embedded therein wherein the at least one electrostatic clamping electrode 209 is operable to electrostatically clamp a semiconductor substrate on the upper surface 206 of the platen 205 during processing. As shown in FIG. 2 the platen 205 can also include a lower RF electrode 265 that may be grounded or supplied with RF power during processing of a semiconductor substrate. Preferably, as shown in FIG. 3, the platen 205 includes only a single electrode 209a embedded therein that serves as both an electrostatic clamping electrode and a RF electrode.

Referring back to FIGS. 2 and 3, the platen 205 can also include at least one heater 260 embedded therein that is operable to control the temperature across the upper surface 206 of the platen 205 and thereby the temperature across the semiconductor substrate during processing. The at least one heater 260 can include electrically resistive heater film and/or one or more thermoelectric modules. Preferably, electrical connections to the at least one electrostatic clamping electrode 209, the at least one heater 260, the single electrode 209a, and/or the lower RF electrode 265 that are disposed in the interior 213 of the stem 210 extend through respective openings 251 in the upper gas tube flange 253 such that the electrical connections may be respectively connected to electrical contacts (not shown) formed in the platen 205 that are in electrical communication with the respective at least one electrostatic clamping electrode 209, the at least one heater 260, the single electrode 209a and/or the lower RF electrode 265. In this manner, the at least one electrostatic clamping electrode 209, the at least one heater 260, the single electrode 209a, and/or the lower RF electrode 265 may be powered during processing of a semiconductor substrate.

In an embodiment, the platen 205 can include discrete layers that are diffusion bonded together wherein the at least one electrostatic clamping electrode 209, the lower RF electrode 265 (or the single electrode 209a), and the at least one heater 260 can be sandwiched between the discrete layers of the platen 205. The upper surface 206 of the platen 205 preferably includes a mesa pattern 206a formed therein wherein a lower surface of a semiconductor substrate is supported on the mesa pattern 206a and a backside purge gas or a backside heat transfer gas can be supplied to the region below the semiconductor substrate between the mesas of the mesa pattern 206a. An exemplary embodiment of a mesa pattern and method of forming a mesa pattern can be found in commonly assigned U.S. Pat. No. 7,869,184, which is hereby incorporated herein in its entirety.

The exposed surfaces of the platen 205, the stem 210, and the backside gas tube 250 are made of ceramic material which preferably does not lead to substrate contamination during processing when the platen 205, stem 210, and/or backside gas tube 250 are exposed to processing conditions. Preferably, exposed surfaces of the platen 205, the stem 210, and/or the backside gas tube 250 are formed of aluminum nitride. The upper surface of the upper gas tube flange 253 is preferably diffusion bonded to the lower surface 208 of the platen 205 and the lower surface of the upper gas tube flange 253 is preferably diffusion bonded to an upper surface of the upper stem flange 215 so as to form a vacuum seal between the interior 213 of the stem 210 and a vacuum chamber in which the substrate pedestal module 320 is disposed. Preferably, the contact area between the upper surface of the upper gas tube flange 253 and the lower surface 208 of the platen 205 is about equal to the contact area between the lower surface of the upper gas tube flange 253 and the upper surface of the upper stem flange 215. More preferably, the contact area between the upper surface of the upper gas tube flange 253 and the lower surface 208 of the platen 205 is equal to the contact area between the lower surface of the upper gas tube flange 253 and the upper surface of the upper stem flange 215. FIG. 2 illustrates an embodiment of the substrate pedestal module 320 wherein the contact area between the upper surface of the upper gas tube flange 253 and the lower surface 208 of the platen 205 is equal to the contact area between the lower surface of the upper gas tube flange 253 and the upper surface of the upper stem flange 215. In this embodiment, a gap 230 is formed between a portion of the upper gas tube flange 253 and the lower surface 208 of the platen 205. In an alternate embodiment, as illustrated in FIG. 3, the substrate pedestal module 320 can be formed such that there is no gap between the upper surface of the upper gas tube flange 253 and the lower surface 208 of the platen 205.

Further disclosed herein is a method of making a substrate pedestal module 320. The method of making the substrate pedestal module 320 includes positioning an upper ceramic surface of an upper gas tube flange 253 against a lower ceramic surface 208 of a platen 205. The upper ceramic surface of the upper gas tube flange 253 is diffusion bonded to the lower ceramic surface 208 of the platen 205. In an embodiment, an upper ceramic surface of an upper stem flange 215 is simultaneously positioned against a lower ceramic surface of the upper gas tube flange 253 wherein the upper ceramic surface of the upper gas tube flange 253 is simultaneously diffusion bonded to the lower ceramic surface of the platen 205 while the upper ceramic surface of the upper stem flange 215 is diffusion bonded to the lower ceramic surface of the upper gas tube flange 253. To simultaneously diffusion bond the upper ceramic surface of an upper stem flange 215 to the lower ceramic surface of the upper gas tube flange 253 and the upper ceramic surface of the upper gas tube flange 253 to the lower ceramic surface of the platen 205 the contact area between the upper ceramic surface of the upper stem flange 215 and the lower ceramic surface of the upper gas tube flange 253 as well as the contact area between the upper ceramic surface of the upper gas tube flange 253 and the lower ceramic surface 208 of the platen 205 are equal or about equal such that the ceramic surfaces that are diffusion bonded together form a vacuum seal. In this manner, the platen 205, the stem 210, and the backside gas tube 250 can be integrally connected in a single diffusion bonding process.

In an alternate embodiment, if the contact area between the upper ceramic surface of the upper gas tube flange 253 and the lower ceramic surface 208 of the platen 205 is not equal to the contact area between the lower ceramic surface of the upper gas tube flange 253 and the upper ceramic surface of the upper stem flange 215 then the upper ceramic surface of the upper gas tube flange 253 is first diffusion bonded to the lower ceramic surface 208 of the platen 205 wherein the upper ceramic surface of the upper stem flange 215 is subsequently bonded to a lower ceramic surface of the upper gas tube flange 253.

While the substrate pedestal module of the semiconductor substrate processing apparatus has been described in detail with reference to specific embodiments thereof, it will be apparent to those skilled in the art that various changes and modifications can be made, and equivalents employed, without departing from the scope of the appended claims.

What is claimed is:

1. A method of making a substrate pedestal module comprising a ceramic platen and ceramic stein useful in a semiconductor substrate processing apparatus, the method comprising:

positioning an upper ceramic surface of an upper gas tube flange of a backside gas tube against a lower ceramic surface of the ceramic platen, the backside gas tube being formed substantially within the ceramic stem and including at least one opening in the upper gas tube flange such that at least one respective electrical connection can extend through the upper gas tube flange; and diffusion bonding the upper ceramic surface of the upper gas tube flange to the lower ceramic surface of the platen so as to form a first vacuum seal.

2. The method of claim 1, further comprising:

positioning an upper ceramic surface of an upper stein flange of the ceramic stem against a lower ceramic surface of the upper flange of the backside gas tube; and diffusion bonding the upper ceramic surface of the upper stem flange to the lower ceramic surface of the upper gas tube flange so as to form a second vacuum seal.

3. The method of claim 2, wherein the upper ceramic surface of the upper stem flange is diffusion bonded to the lower ceramic surface of the upper gas tube flange after the upper ceramic surface of the upper gas tube flange is diffusion bonded to the lower ceramic surface of the platen.

4. The method of claim 2, wherein the upper ceramic surface of the upper stem flange is diffusion bonded to the lower ceramic surface of the upper gas tube flange at the same time the upper ceramic surface of the upper gas tube flange is diffusion bonded to the lower ceramic surface of the platen.

5. The method of claim 2, wherein there is no gap between the upper surface of the upper gas tube flange and the lower surface of the platen.

6. The method of claim 2, wherein a gap is formed between a portion of the upper gas tube flange and the lower surface of the platen.

7. The method of claim 2, wherein a contact area between the upper surface of the upper gas tube flange and the lower surface of the platen is about equal to a contact area between the lower surface of the upper gas tube flange and the upper surface of the upper stem flange.

8. The method of claim 2, wherein the backside gas tube, the platen and the stem are formed of aluminum nitride.

9. The method of claim 1, wherein the backside gas tube is centrally located in the interior of the stem.

10. The method of claim 1, wherein the backside gas tube is located off-center in the interior of the stem.

11. The method of claim 1, wherein an outer periphery of the upper gas tube flange is located on a radius no greater than ¼ the outer diameter of the platen.

12. A method of processing a semiconductor substrate in a semiconductor substrate processing apparatus for processing semiconductor substrates, the method comprising:

placing a substrate into a vacuum chamber on a substrate pedestal, the substrate pedestal module including a platen made of ceramic material having an upper surface configured to support the substrate thereon during processing; a stem of the substrate pedestal being made of ceramic material having an upper stein flange that supports the platen, and a backside gas tube made of ceramic material that is located in an interior of the stem, the backside gas tube including an upper gas tube flange that is located between a lower surface of the platen and an upper surface of the upper stem flange, wherein the backside gas tube is in fluid communication with at least one backside gas passage of the platen and the backside gas tube is configured to supply a backside gas to a region below a lower surface of the substrate that is to be supported on the upper surface of the platen during processing, the vacuum chamber including a processing zone in which the substrate is processed;

supplying a process gas through a showerhead module into the vacuum chamber, the process gas supplied from a process gas source that is in fluid communication with the vacuum chamber;

supplying the process gas from the process gas source into the processing zone;

supplying at least one gas selected from a backside heat transfer gas and a purge gas through the backside gas tube to a region below a lower surface of a semiconductor substrate supported on the upper surface of the platen during processing, the backside gas tube including at least one opening in the upper gas tube flange such that at least one respective electrical connection can extend through the upper gas tube flange; and processing the substrate that is supported on the upper surface of the platen.

13. The method of claim 12, wherein the processing is at least one of chemical vapor deposition, plasma-enhanced chemical vapor deposition, atomic layer deposition, plasma-enhanced atomic layer deposition, pulsed deposition layer, and/or plasma-enhanced pulsed deposition layer.

* * * * *

UNITED STATES PATENT AND TRADEMARK OFFICE
CERTIFICATE OF CORRECTION

PATENT NO. : 10,655,225 B2
APPLICATION NO. : 15/662553
DATED : May 19, 2020
INVENTOR(S) : Gomm et al.

It is certified that error appears in the above-identified patent and that said Letters Patent is hereby corrected as shown below:

In the Claims

Column 7, Line 57, Claim 1, delete "stein" and insert --stem-- therefor

Column 8, Line 5, Claim 2, delete "stein" and insert --stem-- therefor

Column 8, Line 50, Claim 12, delete "stein" and insert --stem-- therefor

Signed and Sealed this
Twenty-fifth Day of January, 2022

Drew Hirshfeld
*Performing the Functions and Duties of the*
*Under Secretary of Commerce for Intellectual Property and*
*Director of the United States Patent and Trademark Office*